United States Patent
Fried et al.

Patent No.: US 6,583,469 B1
Date of Patent: Jun. 24, 2003

(54) SELF-ALIGNED DOG-BONE STRUCTURE FOR FINFET APPLICATIONS AND METHODS TO FABRICATE THE SAME

(75) Inventors: David M. Fried, Ithaca, NY (US); Timothy J. Hoague, Colchester, VT (US); Edward J. Nowak, Essex Junction, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,626

(22) Filed: Jan. 28, 2002

(51) Int. Cl.[7] .............................................. H01L 29/76
(52) U.S. Cl. ................ 257/329; 257/327; 257/347; 257/348; 257/354; 257/330; 257/331; 257/332; 438/212; 438/151; 438/283
(58) Field of Search ................................. 257/327, 329, 257/330, 331, 332, 347, 348, 354; 438/212, 151, 283

(56) References Cited

U.S. PATENT DOCUMENTS

| 4,636,829 A | 1/1987 | Greenwood et al. |
| 5,067,002 A | 11/1991 | Zdebel et al. |
| 5,087,951 A | 2/1992 | Chance et al. |
| 5,521,410 A | 5/1996 | Yamamoto |
| 5,777,362 A | 7/1998 | Pearce |
| 6,194,763 B1 | 2/2001 | Hisamoto et al. |
| 6,246,973 B1 | 6/2001 | Sekine |
| 6,413,802 B1 * | 7/2002 | Hu et al. ............... 438/151 |
| 6,429,538 B1 * | 8/2002 | Lin ........................ 257/797 |

OTHER PUBLICATIONS

Yang, et al., "Scaling the Si MOSFET: From Bulk SOI to Bulk", IEEE Transactions on Electron Devices, vol. 39, No. 7, Jul. 1992.

Jong–Ho Lee, et al., "Super Self–Aligned Double–Gate (SSDG) MOSFET's Utilizing Oxidation Rate Difference and Selective Epitaxy", Microsystems Technology Laboratories, Massachusetts Institute of Technology, Cambridge, MA.

* cited by examiner

Primary Examiner—Sara Crane
Assistant Examiner—Junghwa Im
(74) Attorney, Agent, or Firm—Scully, Scott, Murphy & Presser; Mark F. Chadurjian, Esq.

(57) ABSTRACT

A vertically oriented FET having a self-aligned dog-bone structure as well as a method for fabricating the same are provided. Specifically, the vertically oriented FET includes a channel region, a source region and a drain region. The channel region has a first horizontal width and the source and drain regions having a second horizontal width that is greater than the first horizontal width. Each of the source and drain regions have tapered portions abutting the channel region with a horizontal width that varies in a substantially linear manner from the first horizontal width to the second horizontal width.

8 Claims, 25 Drawing Sheets

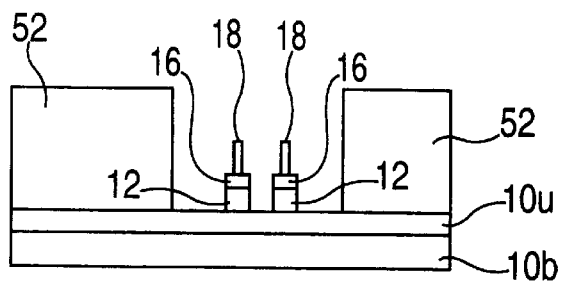 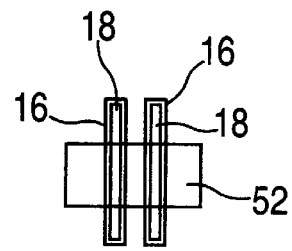
FIG. 24B　　　FIG. 24A
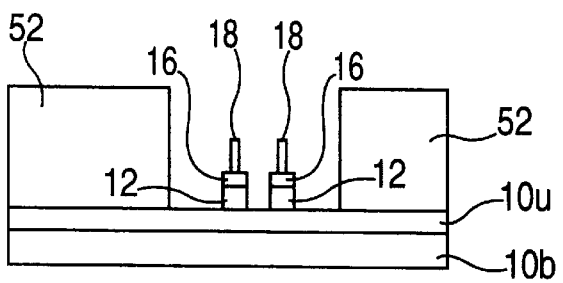 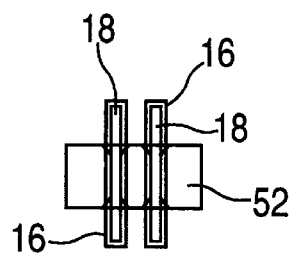
FIG. 25B　　　FIG. 25A
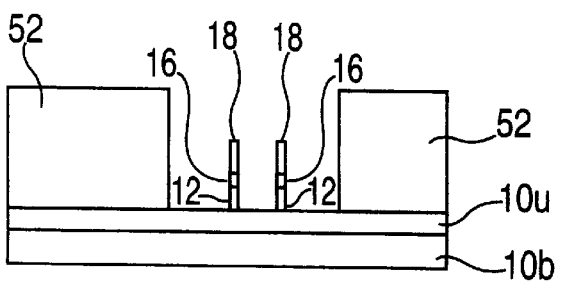 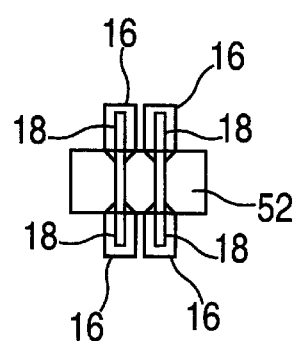
FIG. 26B　　　FIG. 26A

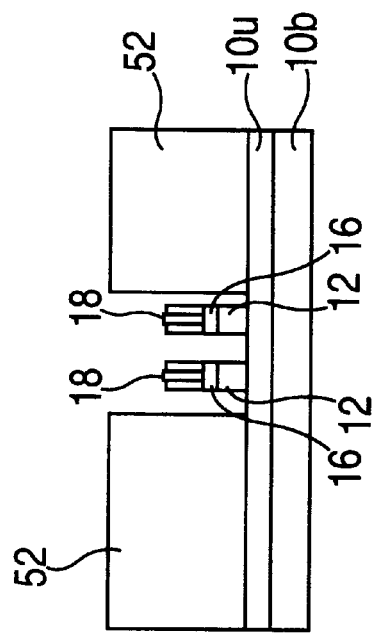
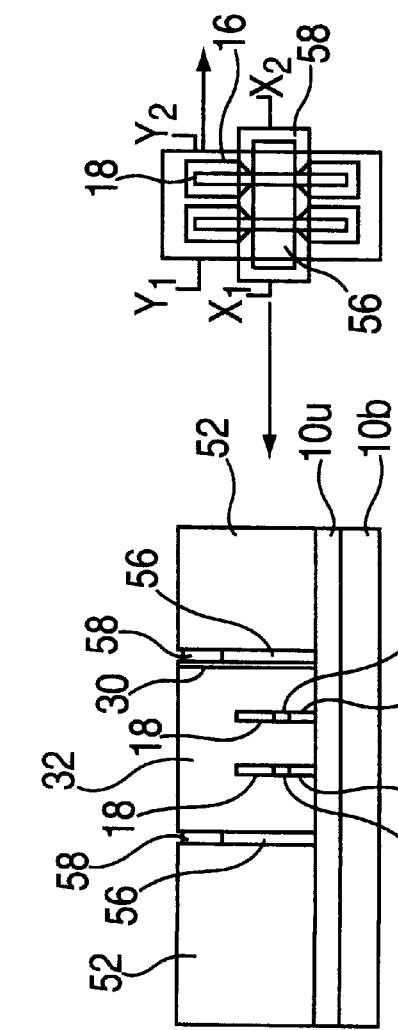
FIG. 31B"
FIG. 31A
FIG. 31B'

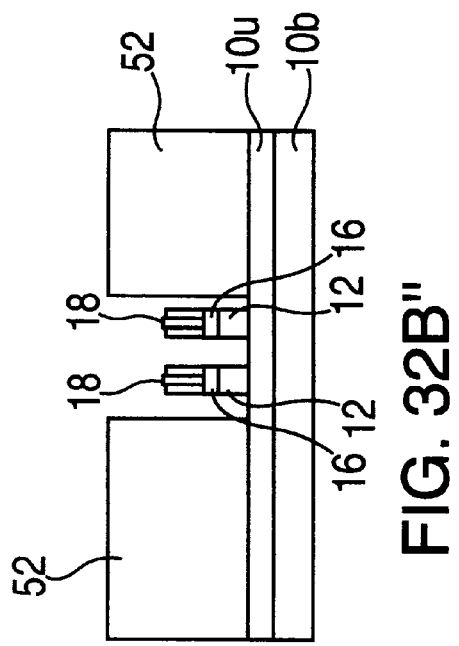
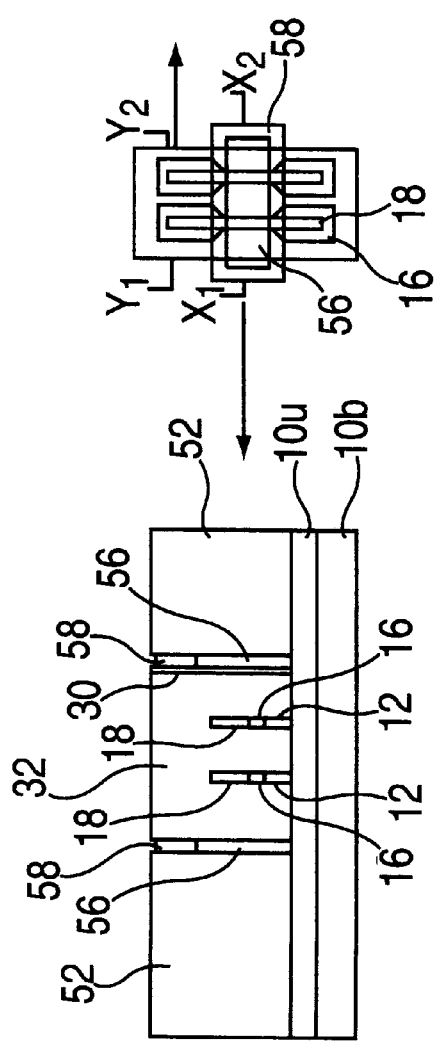
FIG. 32A
FIG. 32B'
FIG. 32B"

SELF-ALIGNED DOG-BONE STRUCTURE FOR FINFET APPLICATIONS AND METHODS TO FABRICATE THE SAME

BACKGROUND OF THE INVENTION

FIELD OF THE INVENTION

The present invention relates to semiconductor devices, and more particularly to a vertically oriented field effect transistor (FET) which includes a dog-bone structure. The present invention also relates to a method of fabricating the aforementioned vertically oriented FET.

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease of threshold voltage Vt in short-channel devices due to two-dimensional electrostatic charge sharing between the gate and the source/drain diffusion regions.

To scale down MOSFET channel lengths without excessive short-channel effects, gate oxide thickness has to be reduced while increasing channel-doping concentration. However, Yan, et al., "Scaling the Si MOSFET: From bulk to SOI to bulk", IEEE Trans. Elect. Dev., Vol. 39, p. 1704, July 1992, have shown that to reduce short-channel effects for sub-0.05 Âμm MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of a typical prior art double-gated MOSFET consists of a very thin vertical Si layer (Fin) for the channel, with two gates, one on each side of the channel. The term "Fin" is used herein to denote a semiconducting material which is employed as the body of the FET. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

For FinFET CMOS (complementary metal oxide semiconductor) applications, it is beneficial to provide a structure that has the thinnest single crystal silicon Fin possible for the device body. However, this makes contacting of the source and drain regions quite difficult. Optimally, the device portion of the Fin is quite thin, with the source and drain regions being thicker, in order to facilitate silicide growth and metal contact schemes.

Jong-Ho Lee, et al. "Super Self-Aligned Double-Gate (SSDG) MOSFETs Utilizing Oxidation Rate Difference and Selective Epitaxy", 1999 IEEE International Devices Meeting (IEDM) Technical Digest-International Electron Devices Meeting, pp. 71–74, provide a self-aligned double-gate MOSFET structure that reportedly has low source/drain resistance which should lead to increased current. The structure disclosed in the Jong-Ho Lee, et al. article (See, in particular FIGS. 1(e), (f), (e') and (f')) contains a thin channel region and wider source/drain regions abutting the channel region. In the disclosed structure, the transition in widths between the channel region and both the source and drain regions is abrupt; therefore the disclosed structure will have an overlap capacitance which is high. It should also be pointed out that in this prior art structure, the thin/thick dimensions between the channel and source/drain regions are in the vertical direction.

In view of the above drawbacks with prior art FinFET structures, there is a continued need for providing a structure in which the FET includes source/drain regions that have a wider width than the width of the abutting channel region where the transition in widths between the channel region and the source/drain regions is not abrupt.

BRIEF SUMMARY OF THE INVENTION

One object of the present invention is to provide a vertically oriented FET which has a dog-bone structure which includes a channel region and wider source/drain regions that abut the channel region.

Another object of the present invention is to provide a vertically oriented FET which has a dog-bone structure in which the source/drain regions are tapered from the channel region thereby avoiding high overlap capacitance that is typically caused by an abrupt transition in widths between the channel region and the abutting source/drain regions.

A further object of the present invention is to provide a vertically oriented FET in which the source/drain regions abutting the channel region have tapered portions with a horizontal width that varies in a substantially linear manner.

A still further object of the present invention is to provide a vertically oriented FET which has a self-aligned dog-bone structure.

An even further object of the present invention is to provide a method of fabricating a self-aligned dog-bone structure for a FinFET structure which implements existing CMOS technologies.

These and other objects and advantages are achieved in the present invention by providing a vertically oriented FET structure having a thin channel region and abutting thick source/drain regions wherein the portions between the source/drain regions and the channel region are tapered in a substantially linear manner. The linear tapering avoids abrupt transitions in width between the thin channel region and the thicker, abutting source/drain regions.

Specifically, and in one aspect of the present invention, the present invention relates to a vertically oriented FET comprising:

a channel region, a source region and a drain region, said channel region having a first horizontal width and said source and drain regions having a second horizontal width that is greater than said first horizontal width, each of said source and drain regions having tapered portions abutting said channel region with a horizontal width that varies in a substantially linear manner from said first horizontal width to said second horizontal width.

Another aspect of the present invention relates to a method of fabricating the inventive vertically oriented FET structure. Specifically, the method of the present invention comprises the steps of:

providing a structure including at least one patterned semiconducting body region, said at least one patterned semiconducting body region is present atop an insulating layer; and etching said patterned semiconducting body region to form a first region, a second region and a third region, said first region having a first horizontal width and said second and third regions having a second horizontal width that is greater than said first horizontal width, each of said second and third regions having tapered portions abutting said first region with a horizontal width that varies in a substantially linear manner from said first horizontal width to said second horizontal width.

It is emphasized that the term "dog-bone" is used herein to describe the etched, patterned semiconductor body region which includes the first (i.e., channel), second and third (i.e., source/drain) regions mentioned above. The inventive dog-bone structure differs from typical prior art dog-bone configurations in that the portions between the thicker second and third regions and the channel region are tapered in a substantially linear manner. Such tapering prevents the structure from exhibiting high overlap capacitance.

BRIEF DESCRIPTION OF THE SEVERAL VIEWS OF THE DRAWINGS

FIGS. 20–32 are pictorial representations through various views showing the processing steps employed in another embodiment of the present invention; A is a top view, and B is a cross-sectional view.

DETAILED DESCRIPTION OF THE INVENTION

Figure 1A:
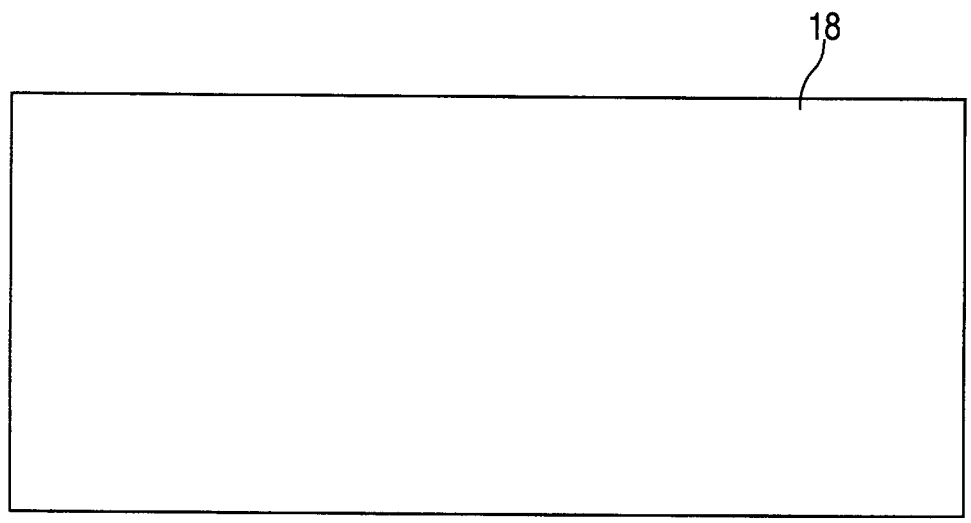
FIGS. 1–18 are pictorial representations through various views showing the processing steps employed in one embodiment of the present invention; A is a top view, and B is a cross-sectional view.

The present invention, which provides a self-aligned dog-bone structure for FinFET applications and methods for fabricating the same, will now be described in greater detail by referring to the drawings that accompany the present application.

Reference is first made to FIGS. 1–18 which illustrate the processing steps employed in one embodiment of the present invention. In these drawings, the views containing the label "A" are top views, while the views containing the label "B" are cross-sectional views. The initial structure that is employed in the present invention is shown, for example, in FIG. 1A (top view) and FIG. 1B (cross-sectional view). Specifically, the initial structure shown in FIGS. 1A–1B includes substrate 10 having a stack comprising semiconducting body 12, i.e., Fin, and hard mask 14 present atop substrate 10.

Substrate 10 includes upper portion 10u which is comprised of an insulating material such as an oxide, nitride, oxynitride or multilayers thereof, and bottom portion 10b which is comprised of a semiconducting material such as Si. Note that regions 10 and 12 may be part of an SOI (silicon-on-insulator) material wherein region 10u is a buried oxide layer which is sandwiched between semiconducting materials 10b and 12. Alternatively, layers 10u and 12 are layers which are separately deposited atop a semiconductor substrate.

The semiconductor body, i.e., Fin region 12, is comprised of any semiconducting material such as single crystalline Si or SiGe and hard mask 14 is comprised of a stack comprising oxide layer 16 and nitride layer 18, respectively. The vertical thicknesses of semiconductor body 12 (i.e., Fin 12) and the hard mask are not critical to the present invention. Typically, semiconducting material layer 12 has a vertical thickness of from about 300 to about 2000 Å..., whereas hard mask 14 has a vertical thickness of from about 100 to about 1000 Å....

Figure 1B:
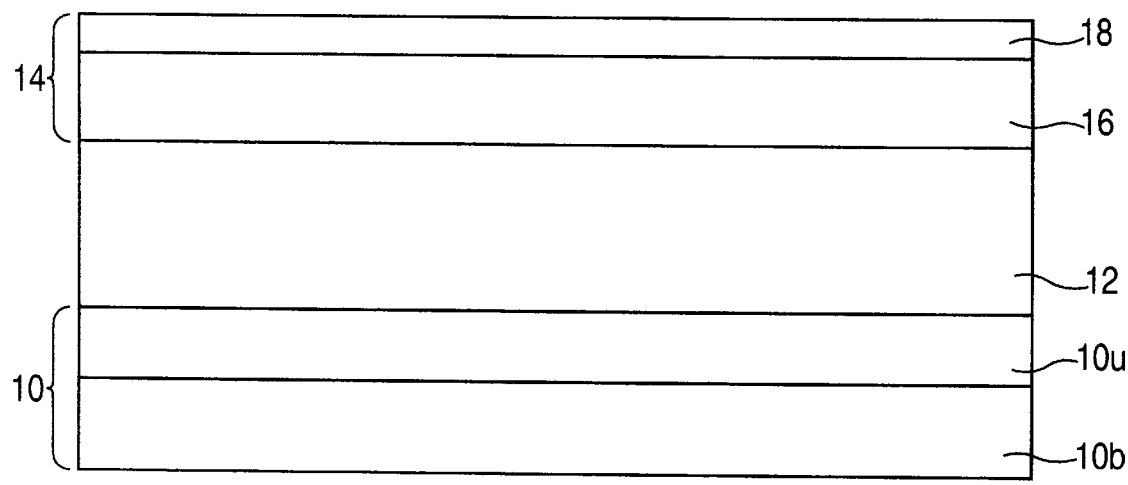

The structure shown in FIGS. 1A–1B is fabricated utilizing conventional processes well known to those skilled in the art. For example, hard mask 14 is formed atop a layer of semiconducting material 12 by utilizing conventional deposition processes such as chemical vapor deposition (CVD), plasma-assisted CVD, or chemical solution deposition. Alternatively, hard mask 14 may be grown on semiconductor body 12 (i.e., Fin 12) utilizing a conventional thermal oxidation process, followed by a nitridation process. Both of these thermal processes, i.e., oxidation and nitridation, are well known to those skilled in the art. The present invention also contemplates forming one of the material layers of the hard mask via deposition, while forming the other material layer via a thermal oxidation/nitridation process.

Figure 2A:
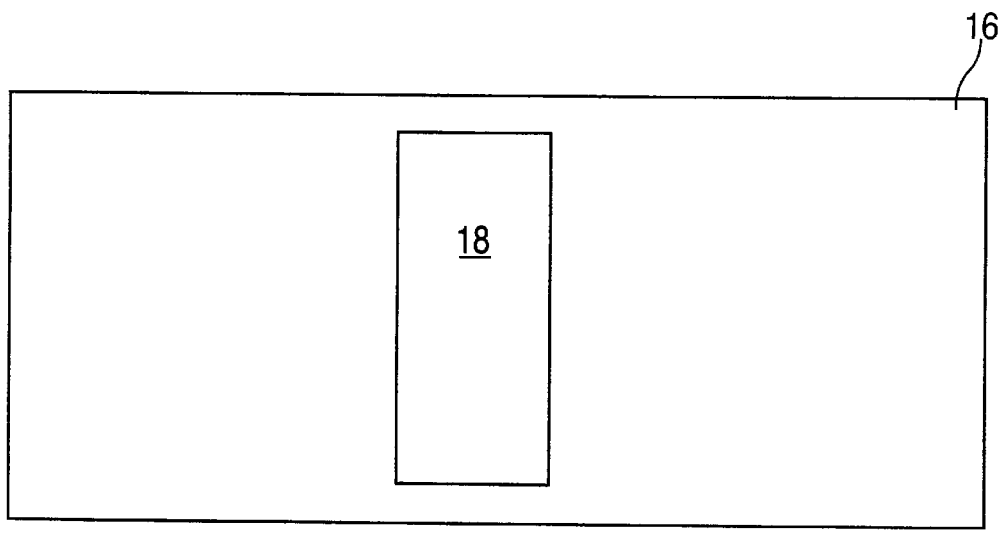
Figure 2B:
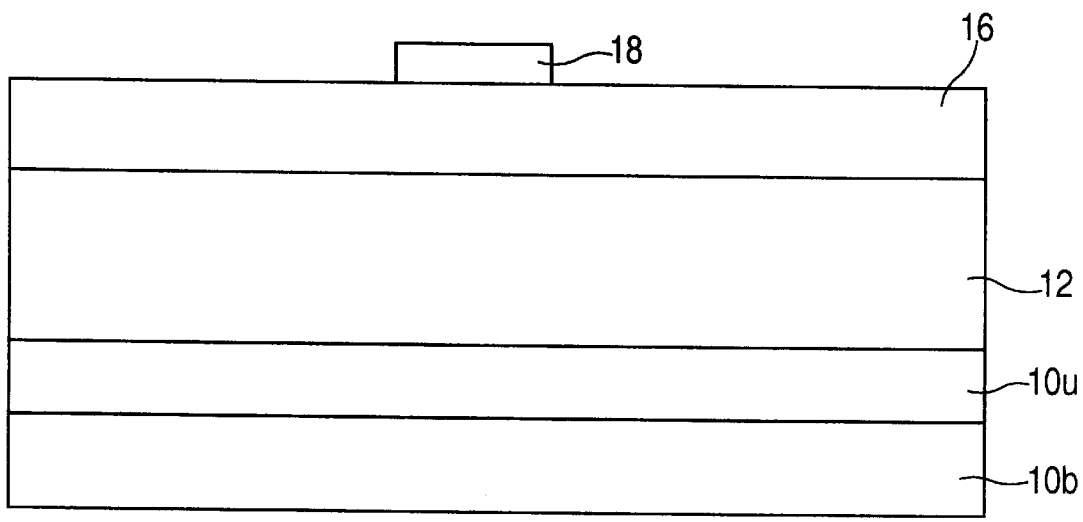

Next, and as shown in FIGS. 2A–2B, nitride layer 18 is patterned utilizing conventional lithography and etching. Specifically, the lithographic process includes applying a photoresist to the nitride layer, exposing the photoresist to a pattern of radiation and developing the pattern into the photoresist utilizing a conventional resist developer. After patterning of the photoresist, the exposed portions of the nitride layer, not protected by the patterned photoresist, are removed utilizing an etching process that is highly selective in removing nitride as compare to oxide. Note that this etching step stops atop an upper surface of oxide layer 16.

Suitable types of etching that can be employed in forming the patterned nitride layer include, but are not limited to: reactive-ion etching, ion beam etching, plasma etching or laser ablation. After this etching step, the photoresist may be removed from the structure. In some embodiments, the patterned photoresist remains on the structure throughout the subsequent etching steps.

Figure 3A:
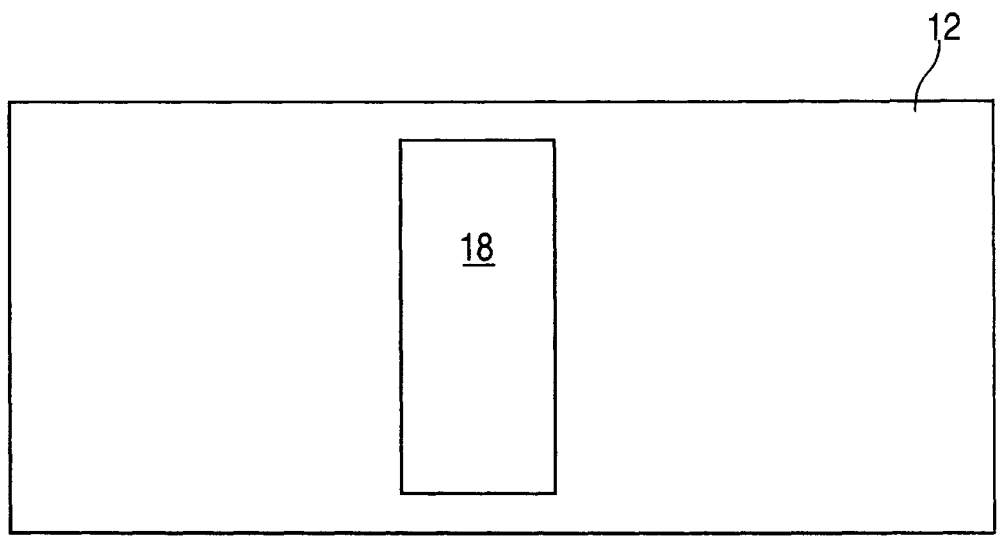
Figure 3B:
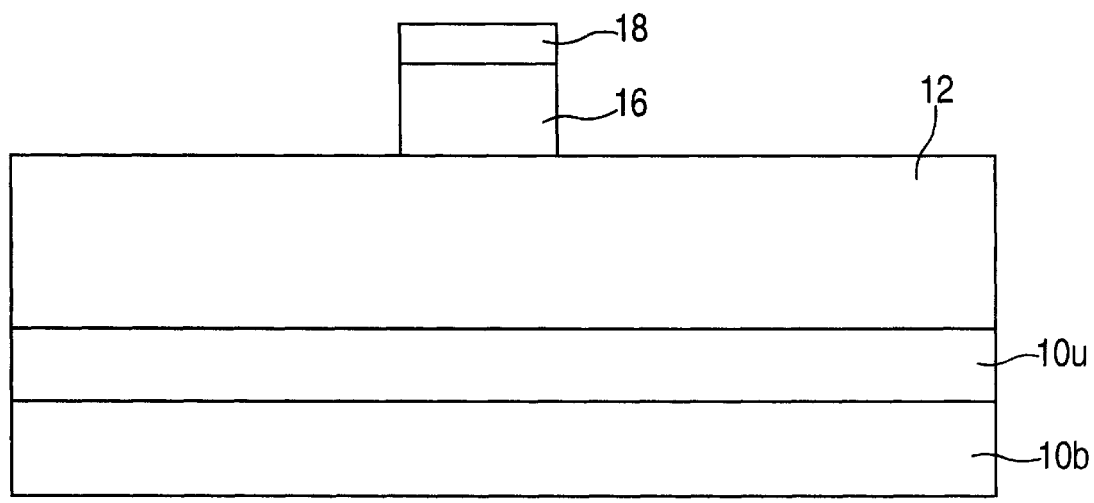

FIGS. 3A–3B illustrate the structure that is formed after exposed portions of oxide layer 16, not protected by patterned nitride layer 18, are removed utilizing an etching process that is highly selective in removing oxide as compared to nitride or semiconducting material. Note that this etching step stops atop an upper surface of underlying semiconductor body 12.

Following the removal of the exposed oxide layer not protected by the patterned nitride layer, exposed portions of semiconductor body 12, not protected by the patterned oxide/nitride hard mask, are then removed utilizing another etching process that is highly selective in removing semiconducting material. Note that this etching process stops atop an upper surface of insulating layer 10u. The resulting structure after the third etching step has been conducted is shown, for example, in FIGS. 4A–4B. It should be noted that although the drawings show the formation of one patterned semiconducting body region (capped with a patterned oxide/nitride hard mask), the present invention also contemplates forming a plurality of such patterned semiconducting body regions on the surface of insulating layer 10u.

Figure 4A:
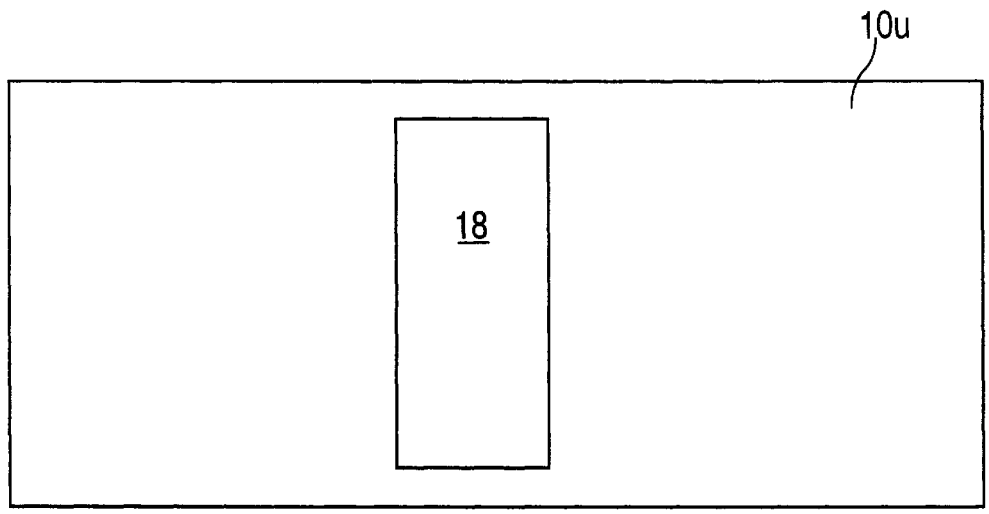
Figure 4B:
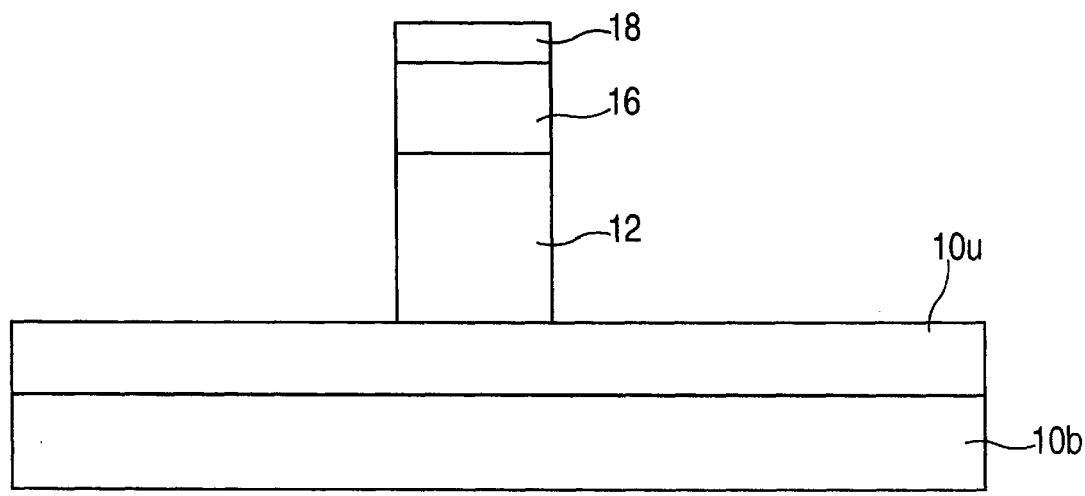

Next, insulating material 20, which may, or may not, be the same as insulating layer 10u is formed (via a conventional deposition process) atop the structure shown in FIGS. 4A and 4B and thereafter the insulating material is planarized using a conventional planarization process such as chemical-mechanical polishing (CMP) or grinding stopping on an upper surface of patterned nitride layer 18. Note the patterned semiconducting body region is now surrounded by insulative materials. In a preferred embodiment of the present invention, insulating material 20 matches that of insulating layer 10u. The resultant structure that is formed after planrization is shown in FIGS. 5A–5B.

Figure 5A:
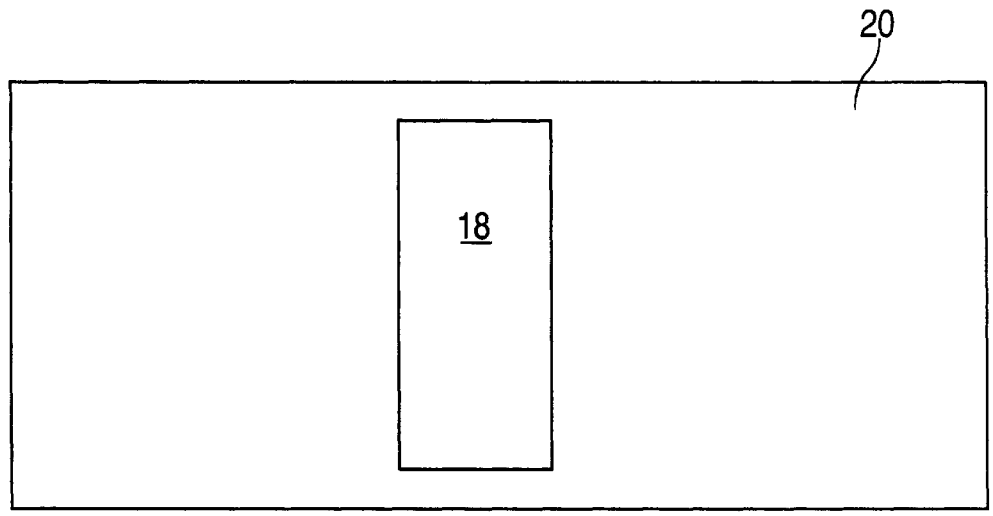
Figure 5B:
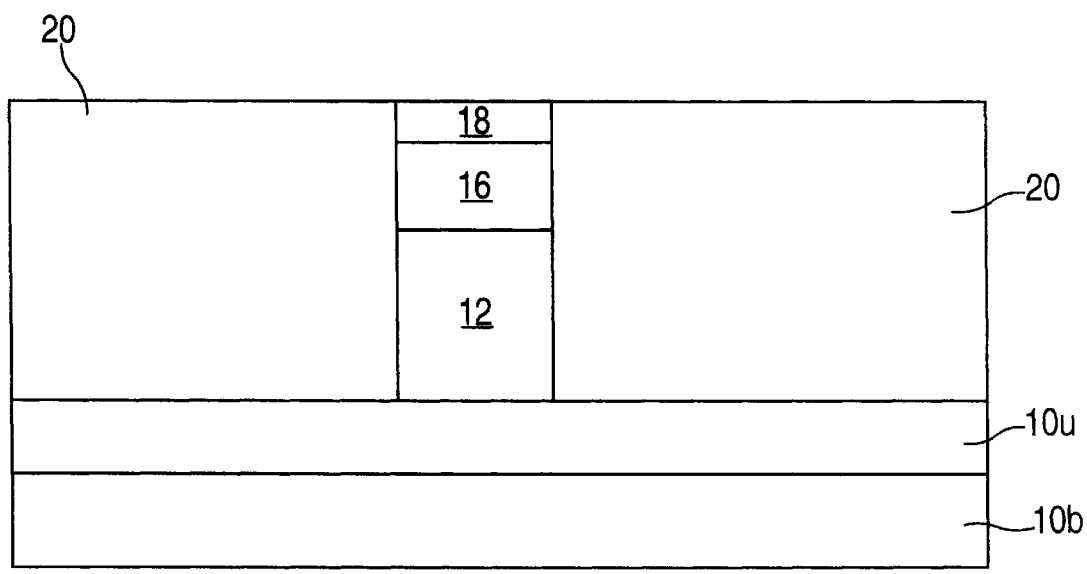
Figure 6A:
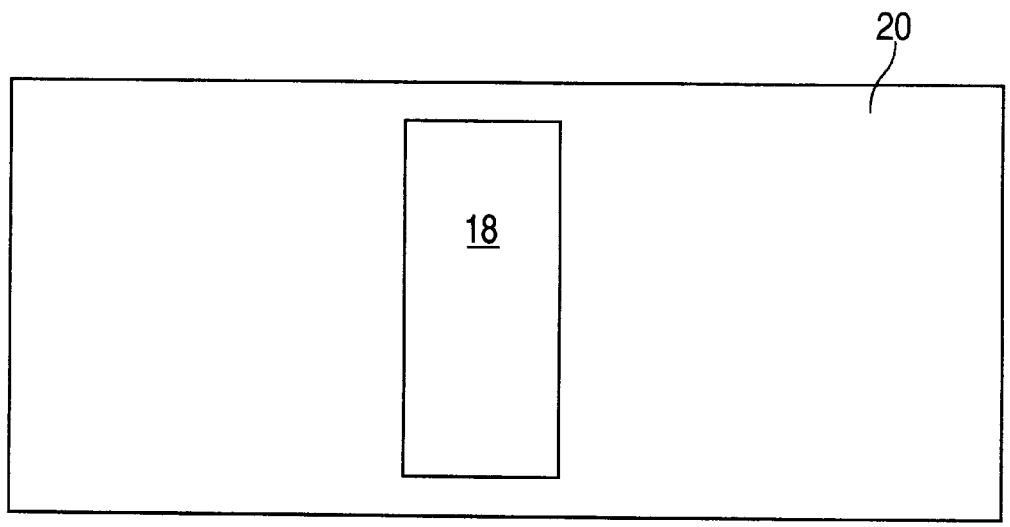
Figure 6B:
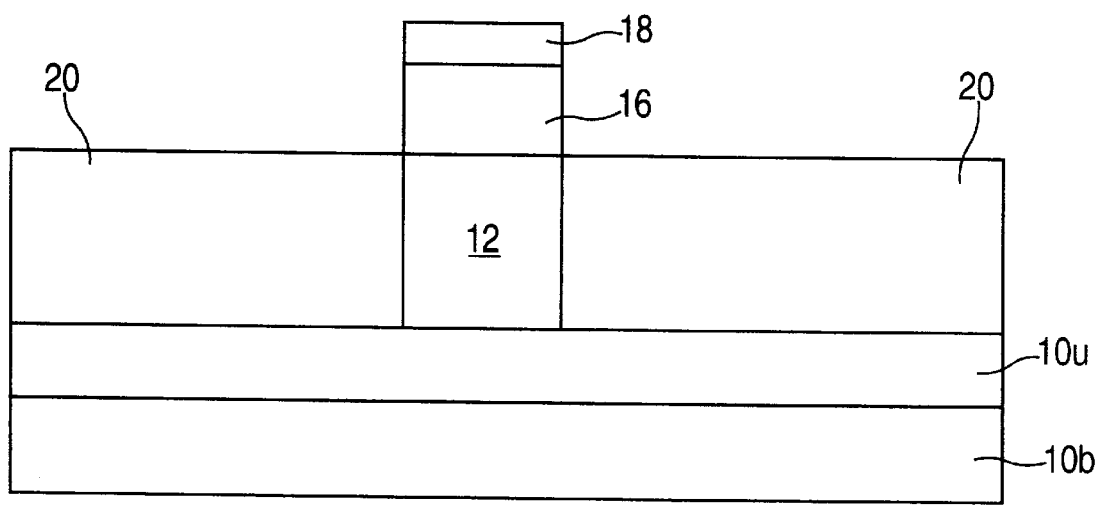

Following the aforementioned deposition and planarization steps, the structure shown in FIGS. 5A–5B is then subjected to a recessing step which is capable of removing a portion of insulating material 20 so as to provide the structure shown, for example, in FIGS. 6A–6B. This recessing step is performed utilizing a conventional timed etching process in which a chemical etchant is employed. Note that the timed etching process exposes vertical sidewalls of patterned oxide hard mask 16 and patterned nitride hard mask 18.

Figure 7A:
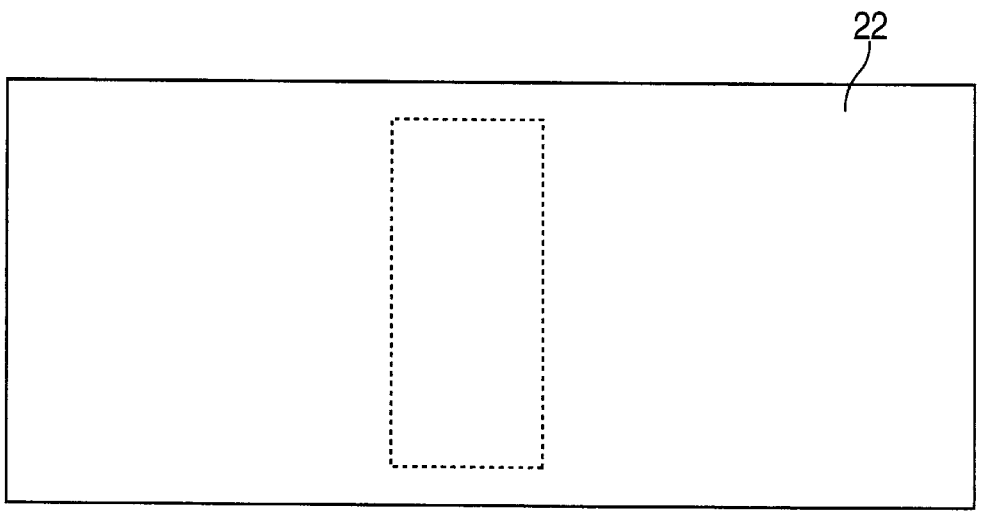
Figure 7B:
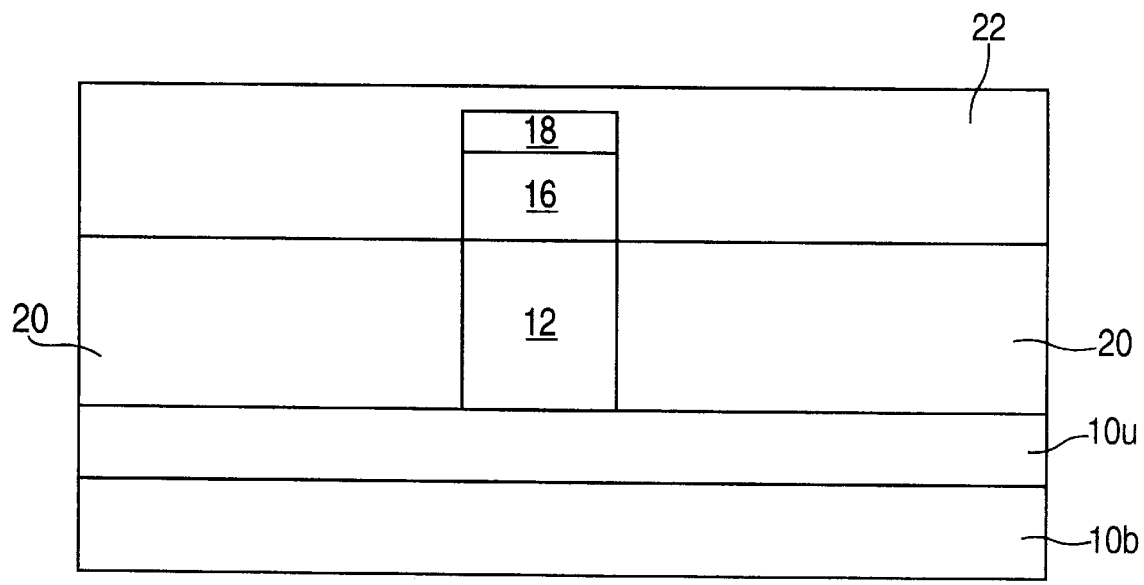

FIGS. 7A–7B show the structure that is formed after planarizing layer 22 has been applied atop the structure provided in FIGS. 6A–6B. Specifically, planarizing layer 22 includes any material such as an anti-reflective coating, which is capable of forming a planarized structure. The planarizing material is formed by a conventional deposition process including, but not limited to: CVD, plasma-assisted CVD, or spin-on coating. Note that in the structure shown in FIGS. 7A–7B, the planarizing layer that is present atop the patterned hard mask/semiconductor body region is thinner than the planarizing material that is formed over regions abutting the patterned hard mask/semiconductor body region.

Figure 8A:
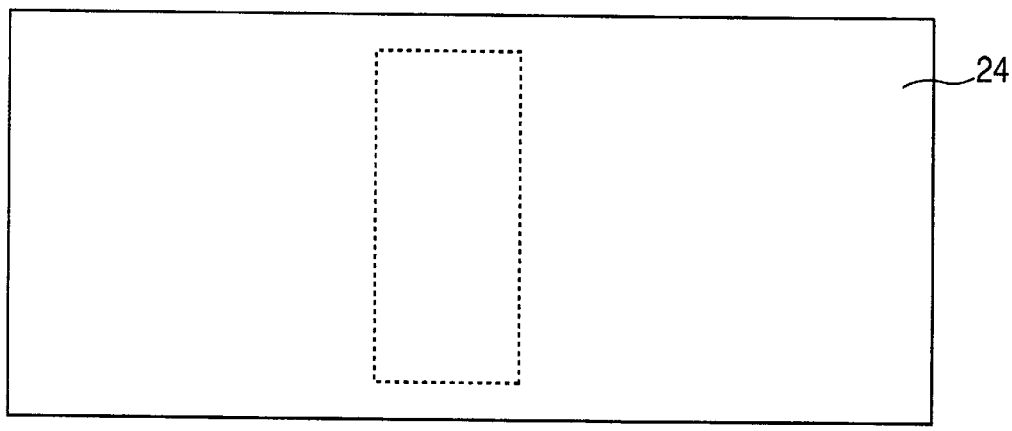
Figure 8B:
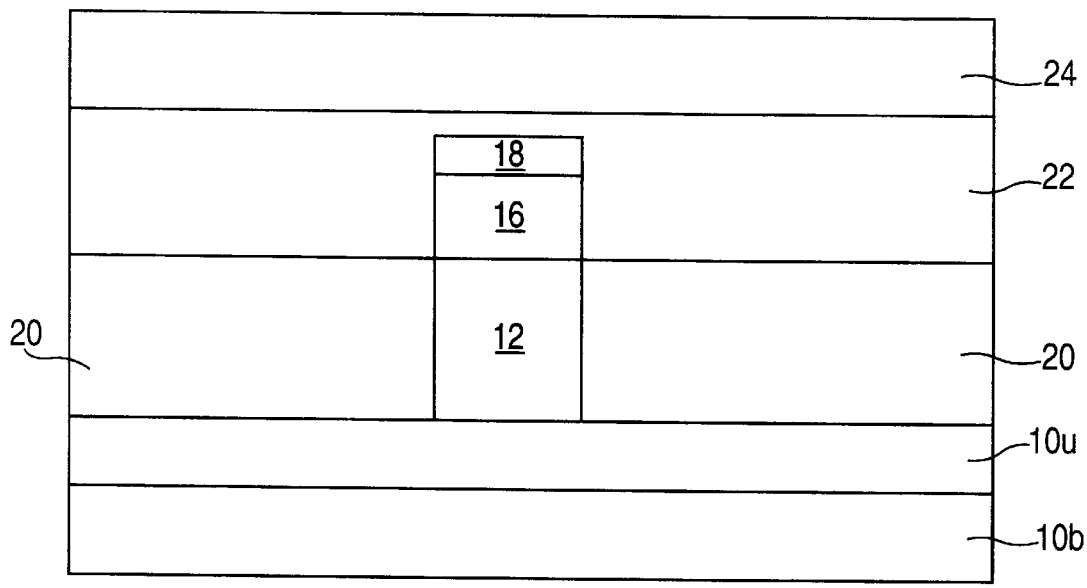
Figure 9A:
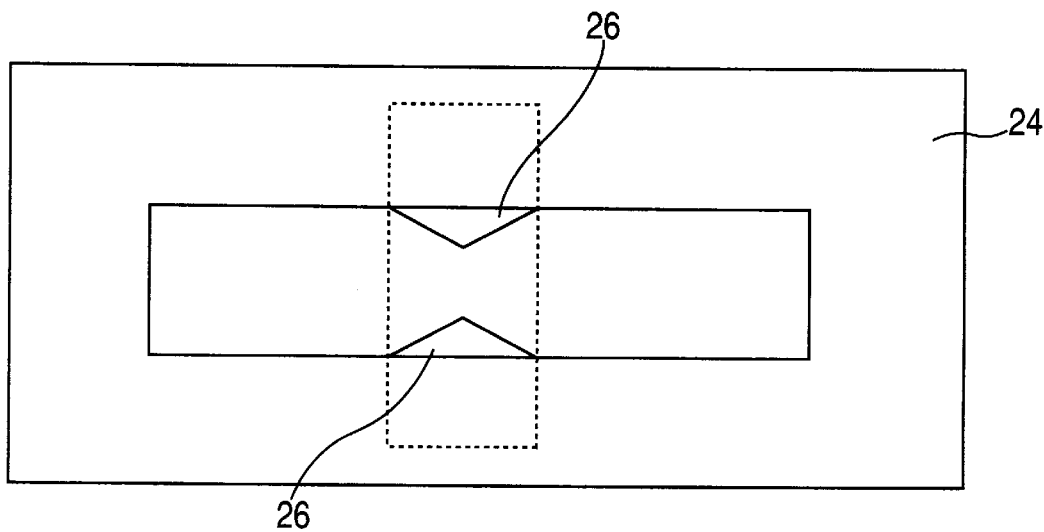
Figure 9B:
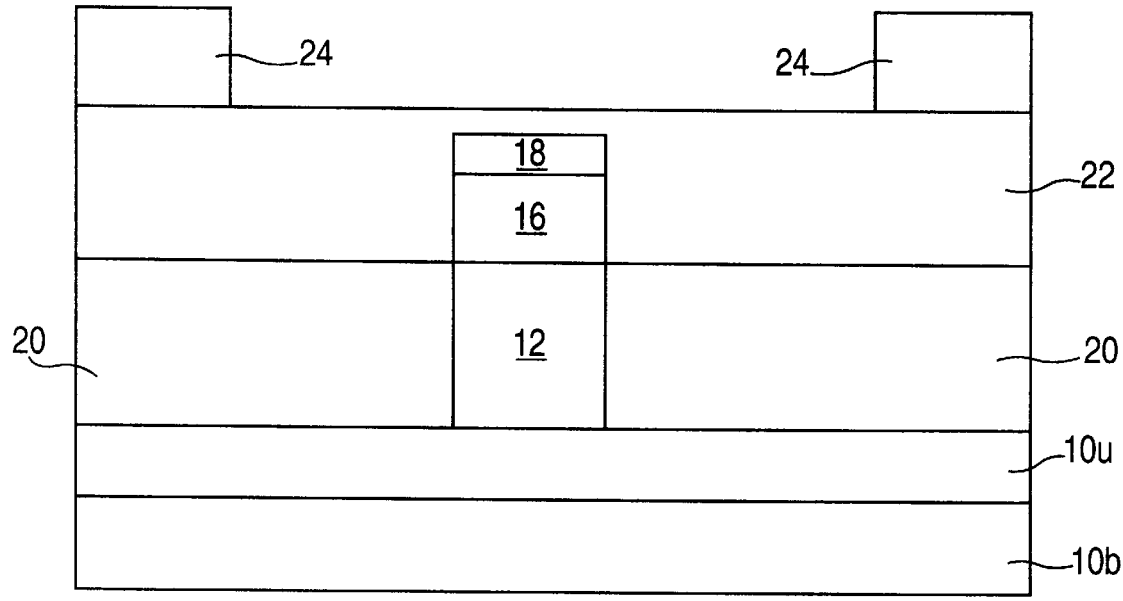

After forming the planarizing layer, a conventional photoresist (labeled as 24 in the drawings) is formed atop planarizing layer 22 providing the structure shown, for example, in FIGS. 8A–8B. The photoresist is formed utilizing a conventional deposition process well known to those skilled in the art. Photoresist 24 is then patterned utilizing conventional lithography so as to provide the structure shown in FIGS. 9A and 9B. Note that the patterned photoresist exposes portions of underlying planarizing layer 22. The difference in reflectivity between the patterned hard mask/Fin with the thin planarizing layer and outside the Fin with the thick planarizing layer causes photoresist 24 to overexpose over Fin 12 near the edges of the gate shape. The overexposed regions are labeled as 26 in FIG. 9A.

The exposed portions of planarizing layer 22 are then removed utilizing an etching process which is highly selective in removing the planarizing material. This etching step stops atop-an upper surface of insulating material 20. Note that in areas over the Fin, this etching step removes all of the planarizing material stopping on an upper surface of nitride layer 18. The resultant structure formed after removing portions of the planarizing layer from the structure is shown, for example, in FIGS. 10A–10B.

Figure 10A:
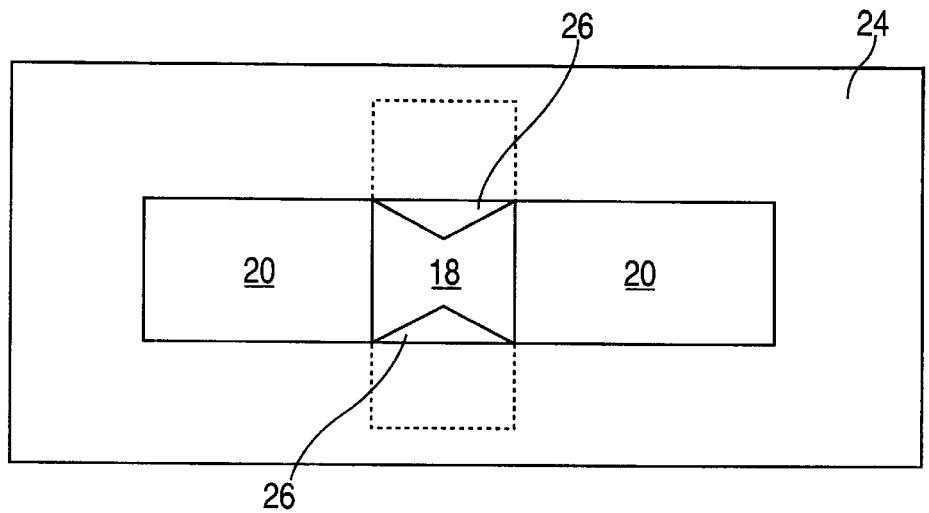
Figure 10B:
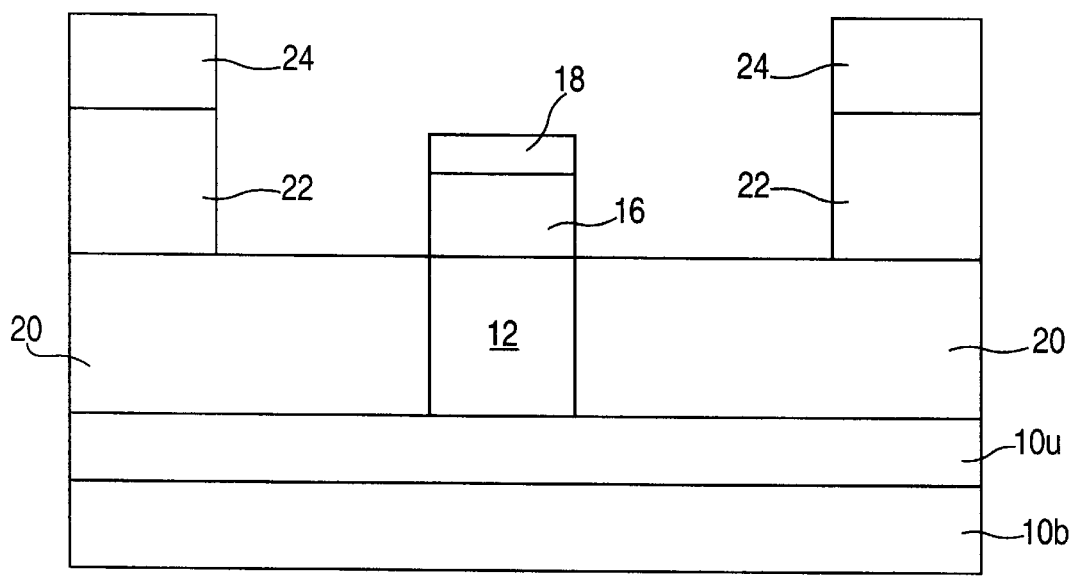
Figure 11A:
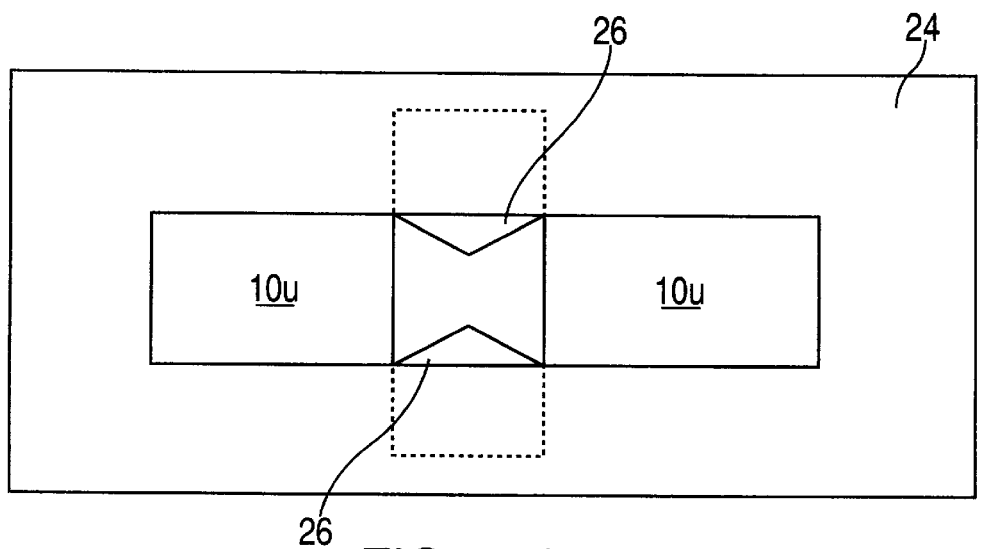
Figure 11B:
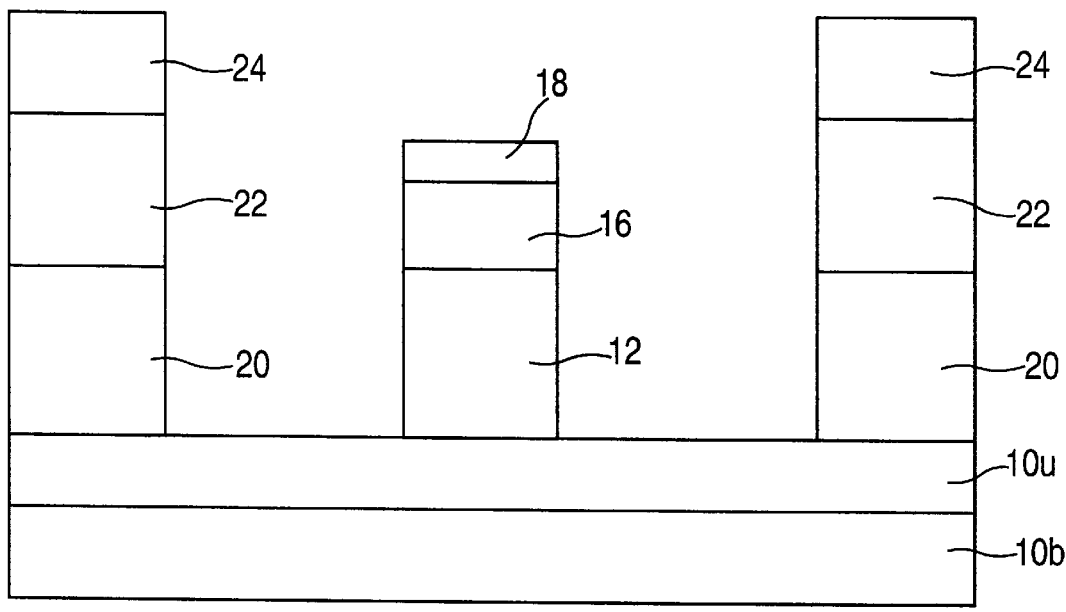

Next, exposed portions of insulating material 20 are then removed from the structure shown in FIGS. 10A–10B utilizing a dry etching process such as RIE which employs chemistries that are highly selective in removing portions of insulating material 20 from the structure. FIGS. 11A–11B illustrate the structure that is formed after the removal of insulating material 20 from the structure. Note that in this structure the patterned hard mask/patterned semiconducting body region has vertical sidewalls that are now exposed.

Figure 12A:
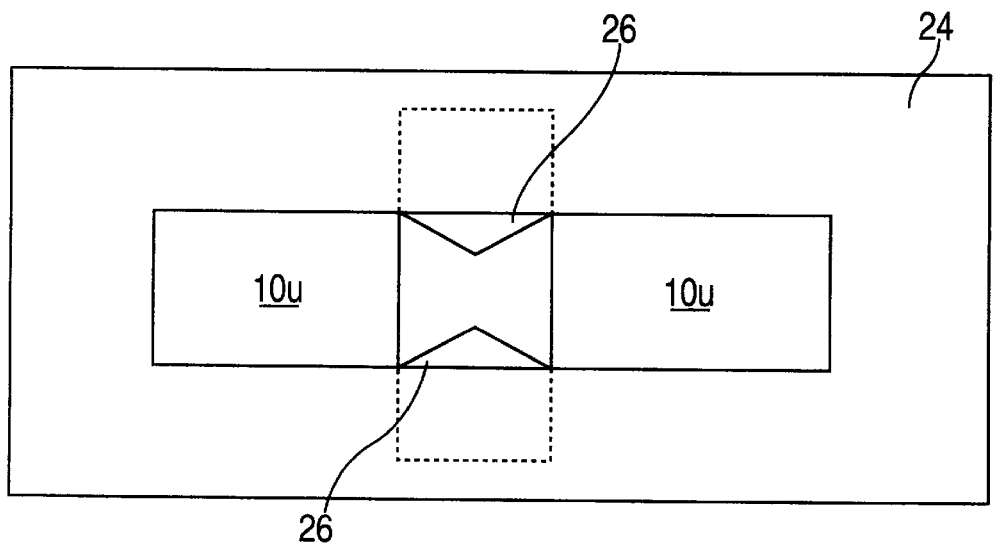
Figure 12B:
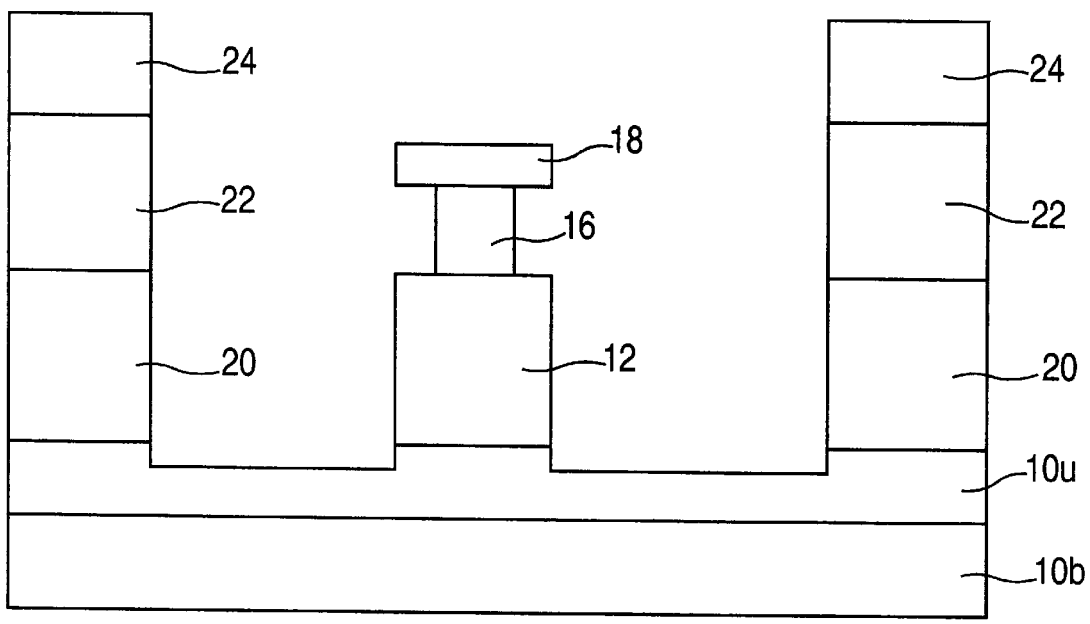
Figure 13A:
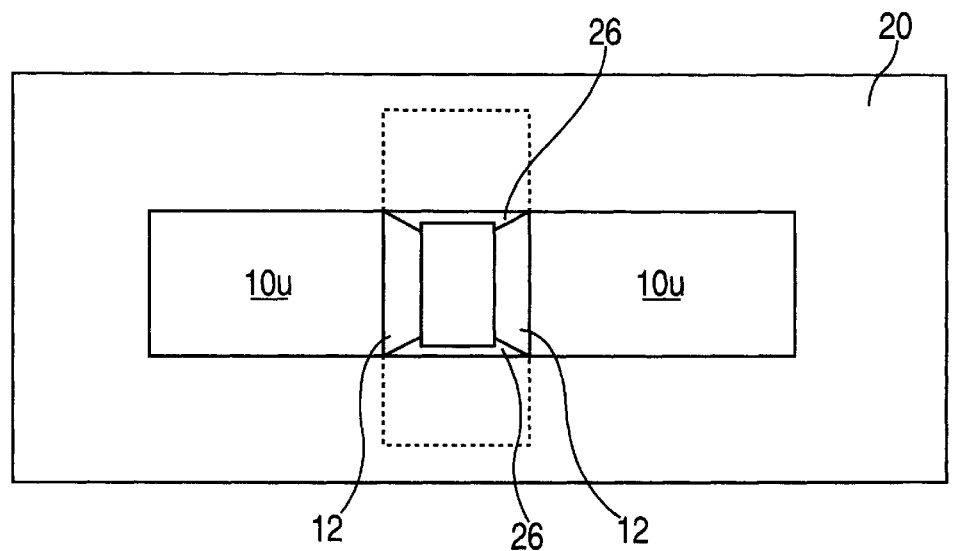
Figure 13B:
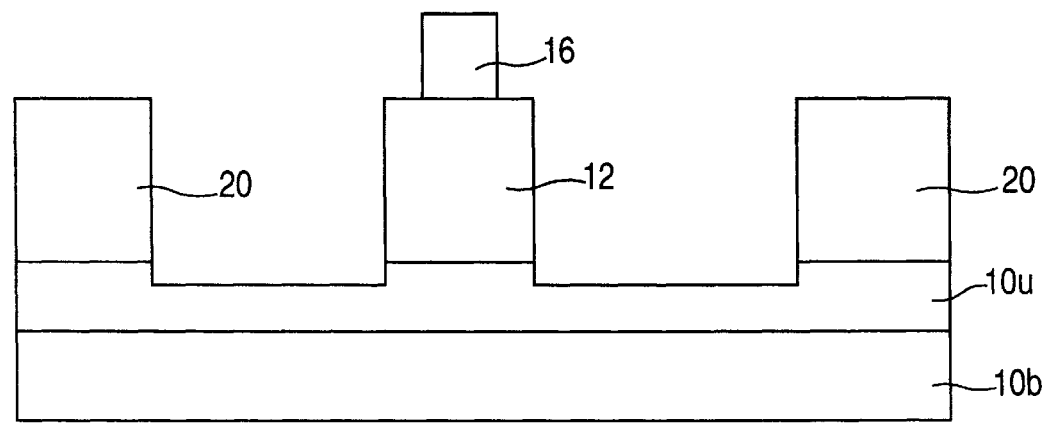

The structure shown in FIGS. 11A–11B is then subjected to a controlled oxide reaction (COR) etching process which undercuts oxide layer 16 remaining in the structure so as to provide a dog-bone pattern to the structure. Specifically, the COR etching process employed in the present invention comprises a plasma of HF and ammonia which serves to undercut oxide layer 16 that lays beneath nitride layer 18. FIGS. 12A–12B show the structure formed after performing the COR etching process. Note that oxide layer 16 is now trimmed and that some of insulating layer 10u that is present beneath the semiconductor body region is recessed by the COR etching step.

After performing the COR etching, patterned photoresist 24, remaining planarizing material 22, and patterned nitride hard mask 18 are removed from the structure utilizing conventional etching processes well known to those skilled in the art which are capable of removing those layers from the structure. This step of the present invention results in the formation of the structure shown, for example, in FIGS. 13A–13B. Note that in the resultant structure a portion of the upper horizontal surface of semiconducting body 12 not protected by trimmed oxide layer 16 is now left exposed.

Figure 14A:
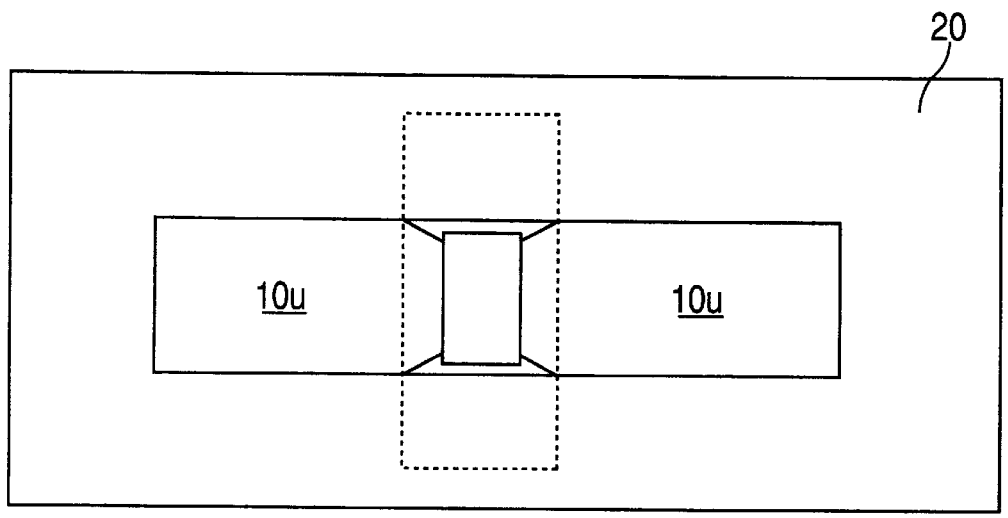
Figure 14B:
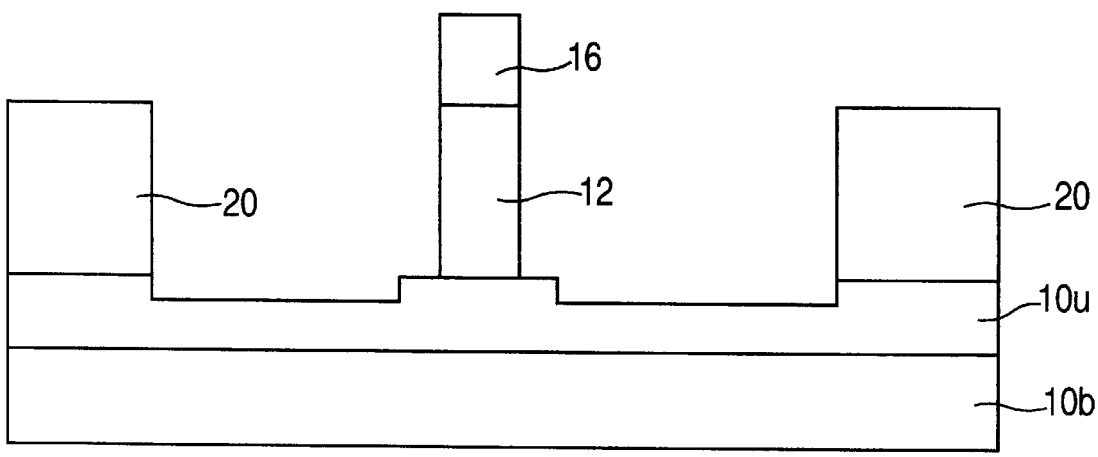

FIGS. 14A–14B show the structure that is formed after patterned semiconductor body 12, i.e., the Fin, is subjected to an etching step which serves to trim the semiconductor body such that the vertical sidewalls of the semiconductor body are aligned with the vertical sidewalls of trimmed oxide layer 16. This etching step is performed utilizing a conventional dry etching process such as RIE.

Following the trimming of the semiconductor body, gate dielectric 30 is formed about the exposed surfaces of trimmed semiconductor body 12 and the trimmed oxide mask 16. The gate dielectric, which may be comprised of an oxide, nitride, oxynitride or a multilayer thereof, is formed utilizing a conventional thermal growth process which may include oxidation, nitridation or oxynitridation. The thickness of the gate dielectric is not critical to the present invention, but typically gate dielectric 30 has a thickness of from about 0.8 to about 5.0 nm, with a thickness of from about 1.2 to about 2.6 nm being more highly preferred. The structure including gate dielectric 30 is shown in FIGS. 15A–15B.

Figure 15A:
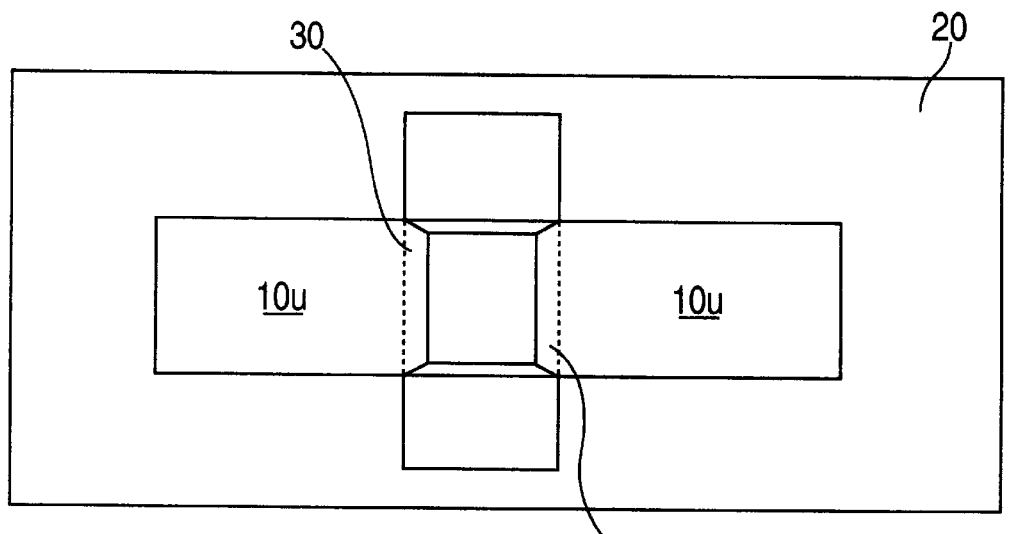
Figure 15B:
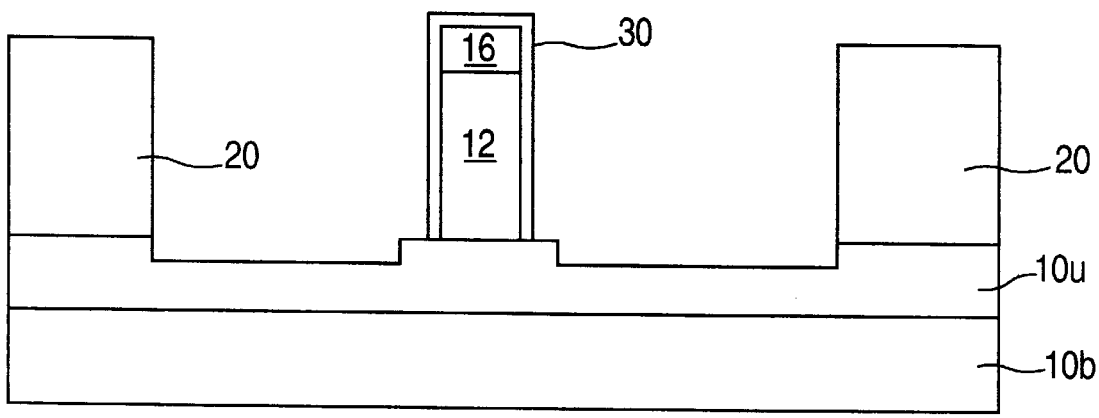

Gate electrode 32 is then formed on all exposed horizontal and vertical surfaces of the structure shown in FIGS. 15A–15B utilizing a conventional deposition process such as CVD, plasma-assisted CVD and chemical solution deposition well known in the art. The gate electrode is comprised of any conventional conductor including conductive metals, conductive metal alloys, suicides and doped polysilicon. When doped polysilicon is employed as the gate electrode, the doped polysilicon may be formed using an in-situ doping deposition process. Alternatively, doped polysilicon gate electrode 32 may be formed by deposition and ion implantation. The resultant structure including gate electrode 32 is shown, for example, in FIGS. 16A–16B.

Figure 16A:
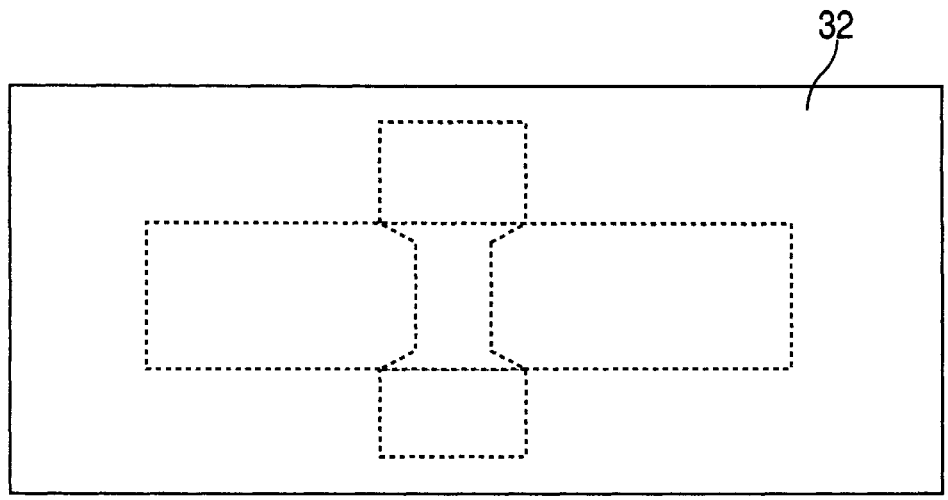
Figure 16B:
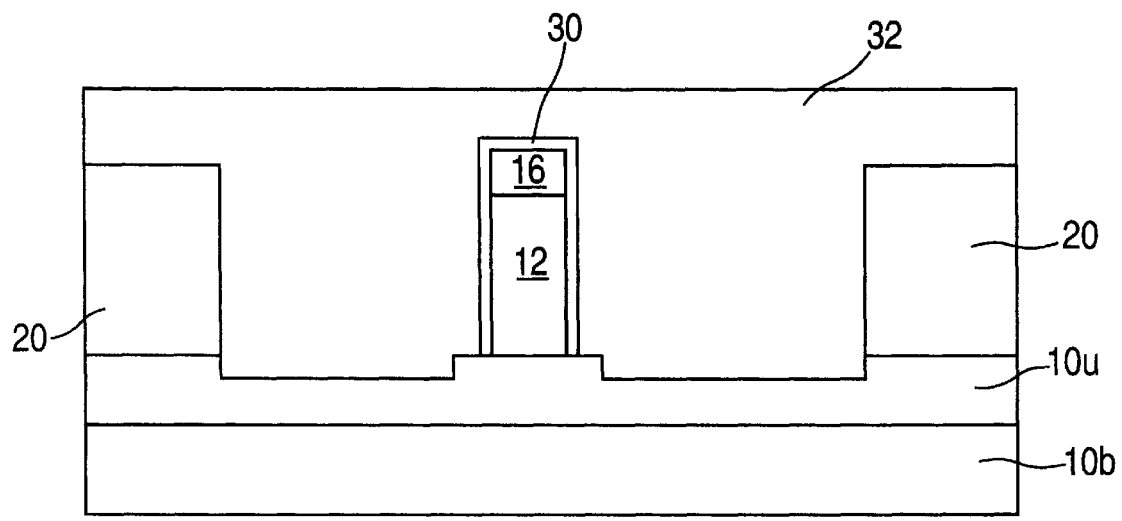
Figure 17A:
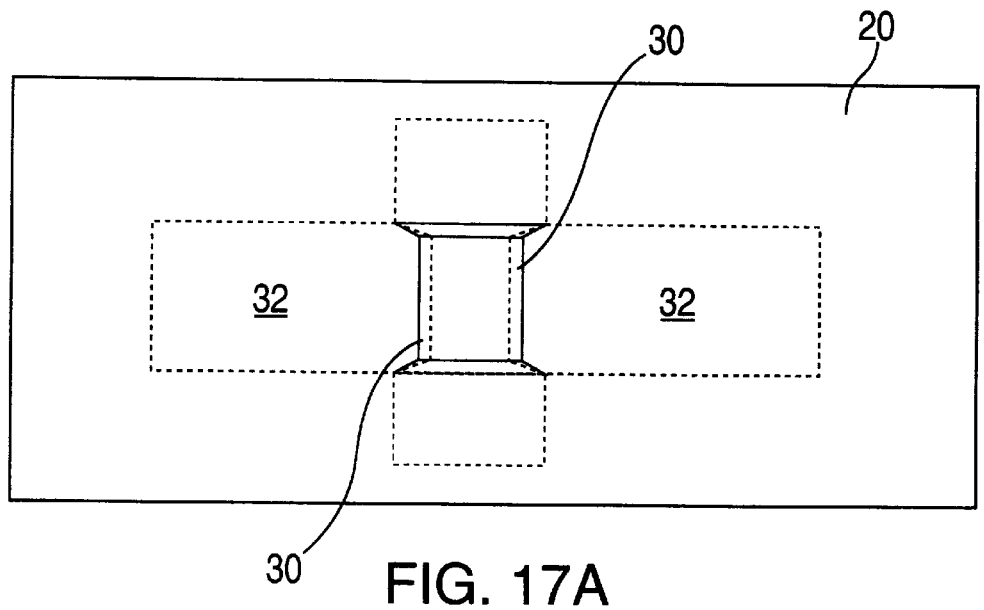
Figure 17B:
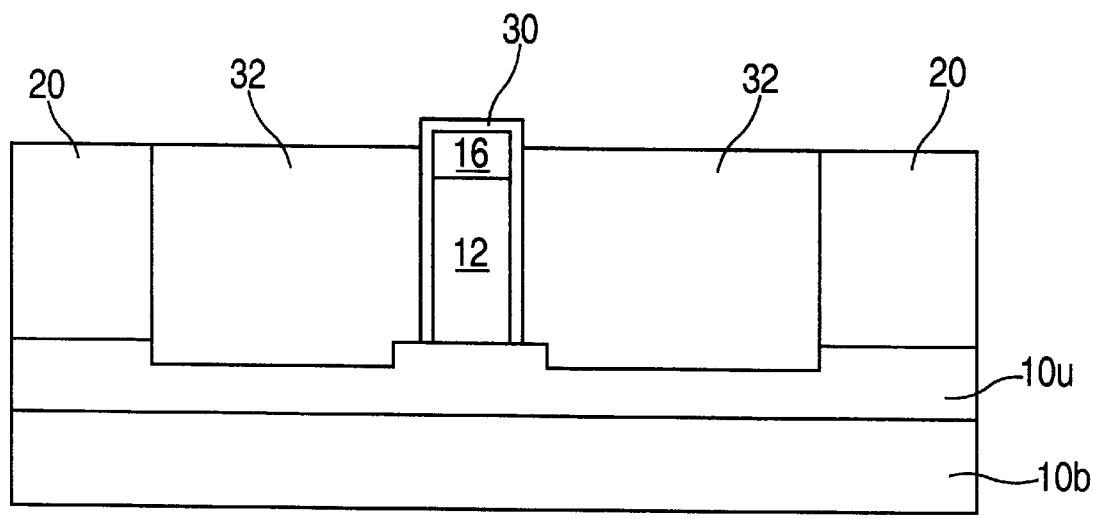

Following formation of the gate electrode, the structure shown in FIGS. 16A–16B is then subjected to a damascene gate planarization step which recesses gate electrode 32 below the upper horizontal surface of gate dielectric 30. The damascene gate planarization step is carried out utilizing a conventional etching process well known to those skilled in the art. The resultant structure that is formed after performing the damascene gate planarization step is shown in FIGS. 17A–17B.

Figure 18A:
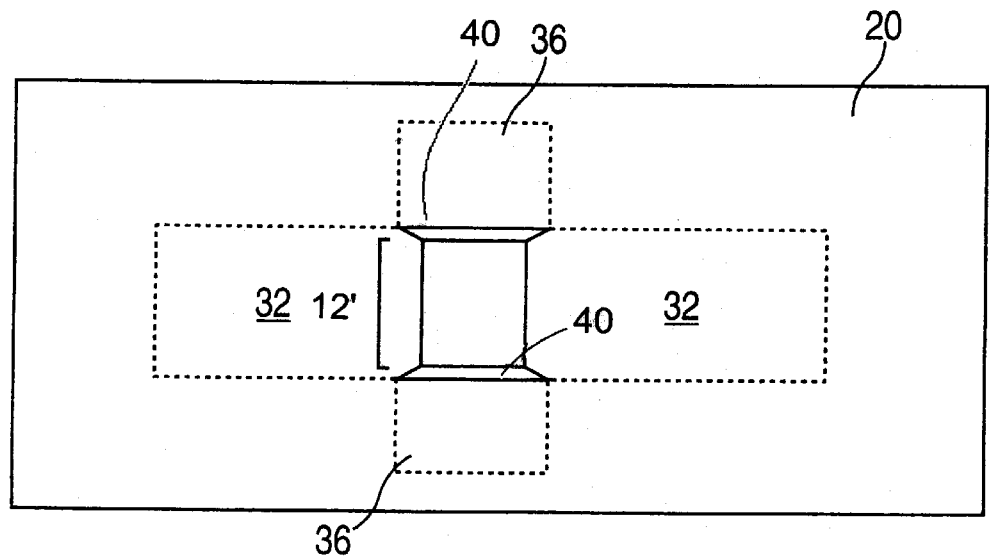
Figure 18B:
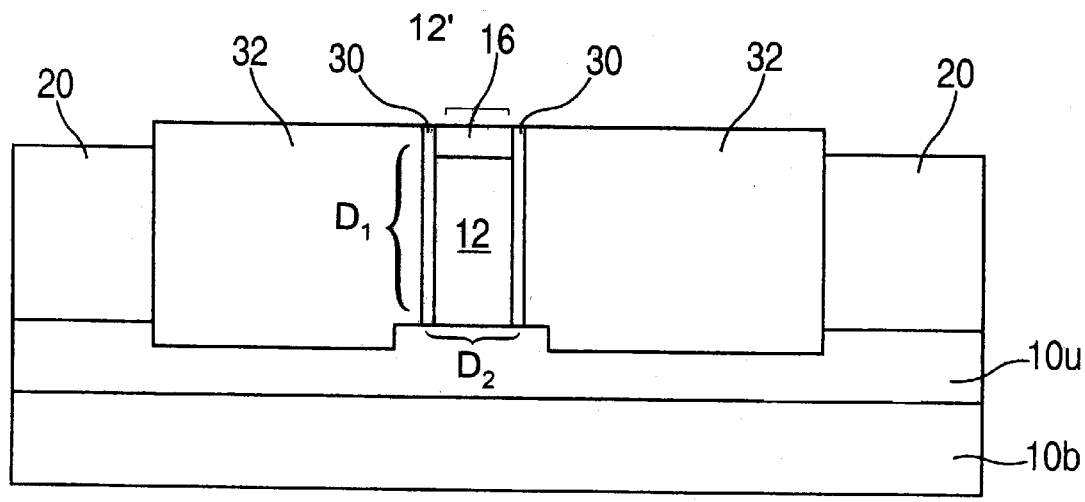

The exposed portions of gate dielectric 30 and hard mask 16 that are not coplanar with the damascene gate electrode is then partially etched so as to be co-planar with the upper surface of damascene gate electrode 32. Note this process step defines the final channel region 12' having a dimension 1 D1 greater than dimension 2 D2. During the etching process some of insulating layer 20 is recessed so as to expose regions in semiconducting layer 12 in which the source/drain regions will be subsequently formed. FIGS. 18A–18B show the resultant structure and reference number 36 is used to denote the area where source/drain regions will be formed. Further note that the resultant structure includes linear tapering portions 40 of said source/drain regions 36 that are aligned with the gate electrodes 32 edge.

Insulating layer 20 is then etched to region 10u and doping and silicidation of the exposed source drain regions may now be performed utilizing conventional ion implantation and silicidation processes well known to those skilled in the art.

Figure 19:
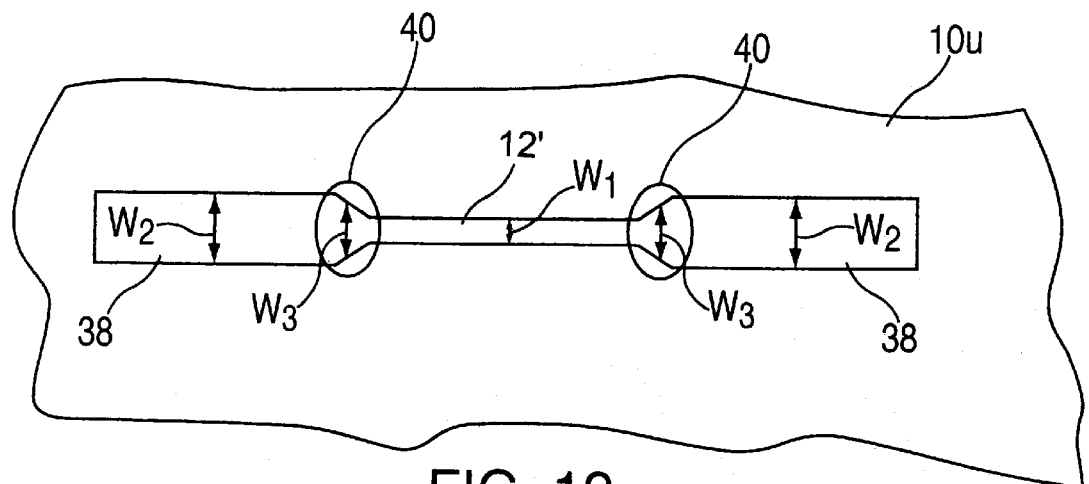
FIG. 19 is a simplistic top view of the dog-bone structure provided in FIGS. 1–18.

FIG. 19 shows a simplistic view of the inventive structure provided by the above processing steps. Specifically, the structure shown in FIG. 19 includes a channel region comprised of patterned semiconductor body 12, and a source region and a drain region. The source/drain regions are labeled as element 38 in FIG. 19. The channel region has a first horizontal width, w1, and the source and drain regions have a second horizontal width, w2, that is greater than the first horizontal width. The source and drain regions have tapered portions (denoted as 40) abutting channel region 12 with a horizontal width, w3, that varies in a substantially linear manner from the first horizontal width, w1, to the second horizontal width, w2. Note that the above configuration of the channel region and the source/drain regions is in the shape of a dog-bone.

Reference is now made to FIGS. 20–32 which illustrate the processing steps employed in another embodiment of the present invention. In these drawings, the views containing the label "A" are top views, while the views containing the label "B" are cross-sectional views. In these drawings, like reference numerals are used to denote elements that correspond to elements present in FIGS. 1–18.

Figure 20B:
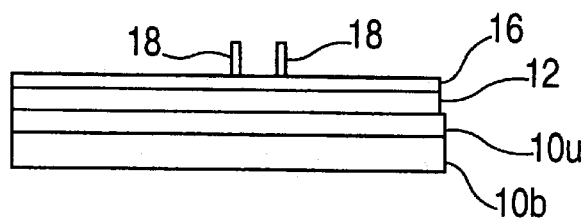
Figure 20A:
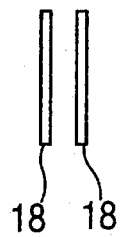

FIGS. 20A and 20B illustrate the initial structure used in the second embodiment of the present invention. Specifically, the initial structure shown in FIGS. 20A and 20B, which is the same as in FIGS. 2A–2B, includes semiconducting portion 10b, insulating material 10u present atop semiconducting portion 10b, semiconducting body 12 present atop insulating material 10u, oxide hard mark 16 present atop semiconducting body 12, and patterned nitride hard mask 18 present atop portions of oxide hard mask 16. The initial structure employed in the second embodiment of the present invention is formed utilizing the various processing steps mentioned above in forming the structure illustrated in FIGS. 2A–2B.

After forming the patterned structure shown in FIG. 20A and 20B, sacrificial spacers 50 are then formed on exposed vertical sidewalls of patterned nitride hard mask 18 utilizing conventional deposition and etching processes well known to those skilled in the art. Sacrificial spacers 50 are comprised of an insulating material other than an oxide. Hence, sacrificial spacers 50 may be comprised of a nitride, oxynitride or any combination thereof. With the sacrificial spacers in place, exposed portions of oxide hard mask 16 are removed utilizing an etching process that is highly selective in removing oxide. Note that the etching step stops atop an upper surface of semiconducting body 12. The resultant structure following spacer formation and removal of exposed portions of oxide hard mask 16 is shown, for example, in FIGS. 21A–21B.

Figure 21B:
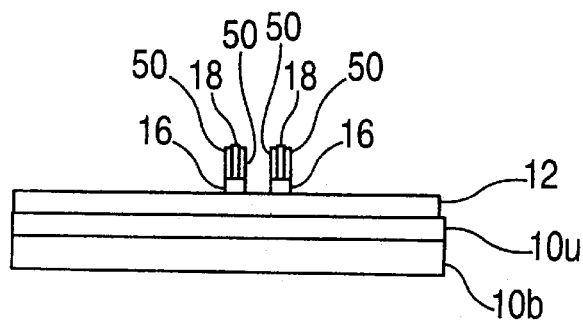
Figure 21A:
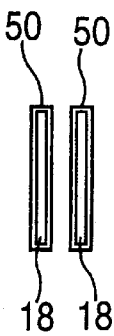
Figure 22B:
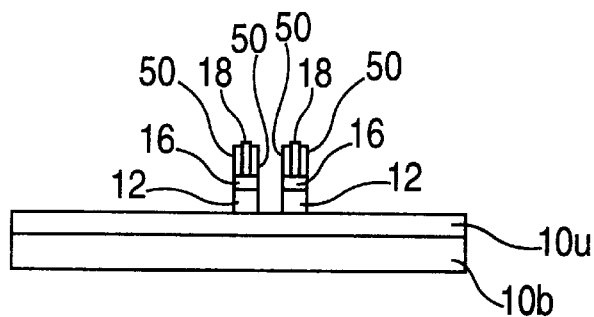
Figure 22A:
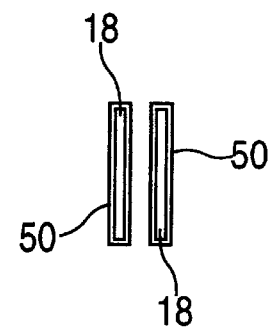
Figure 23B:
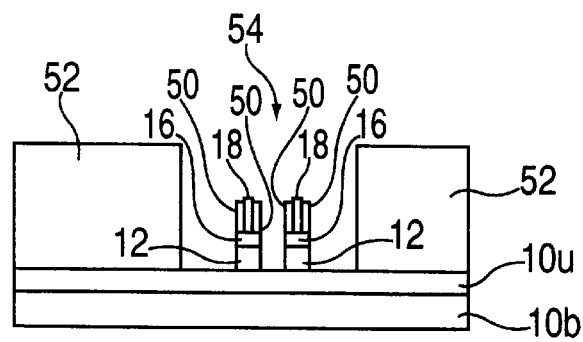
Figure 23A:
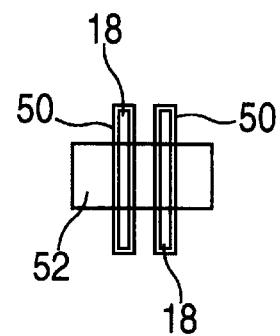

Next, and as shown in FIGS. 22A–22B, the structure shown in FIGS. 21A–21B is then subjected to an etching process that is highly selective in removing the exposed portions of the semiconducting body 12 that are not protected by the previously etched hard mask layers. This etching step stops atop an upper surface of insulating layer 10u.

Insulator 52 is then formed over the structure provided in FIGS. 22A and 22B utilizing a conventional deposition process well known to those skilled in the art such as chemical vapor deposition, CVD. In accordance with the present invention, insulator 52 is composed of an oxide. A photoresist, not shown, is then applied to the top surface of the insulator 52 and thereafter conventional lithography is employed in patterning the photoresist. With patterned photoresist atop the structure, exposed portions of insulator 52 are then removed utilizing an etching process that is highly selective in removing oxide so as to provide opening 54 in the structure. Note that this etching step does not remove the previously patterned regions and that after the opening is provided the patterned photoresist employed in forming the same is typically removed from the structure. The resultant structure formed after theses steps are performed is illustrated, for example, in FIGS. 23A and 23B.

Sacrificial spacers 50 are then selectively removed utilizing a conventional-isotropic etching process so as to provide the structure shown, for example, in FIGS. 24A and 24B. Note that the patterned nitride hard mask 18 now has a width that is thinner than either underlying oxide hard mask 16 or semiconducting body 12.

A COR etching process as described hereinabove is then employed to form corner rounding oxide hard mask 16. This corner rounded hard mask will subsequently provide the dog-bone configuration to the Fin. The structure that is formed after the COR etching step has been performed is shown, for example, in FIGS. 25A and 25B.

Next, and as shown in FIGS. 26A and 26B, the exposed portions of oxide hard mask 16 and the underlying semiconducting body, not including nitride hard mask 18, are then trimmed utilizing an etching process that is highly selective in removing oxide and semiconducting material. The etching may be carried out in a single etching step, or multiple etching steps may be employed. It is noted that this step provides the dog-bone configuration to the underlying semiconducting body, i.e., Fin 12.

Figure 27B:
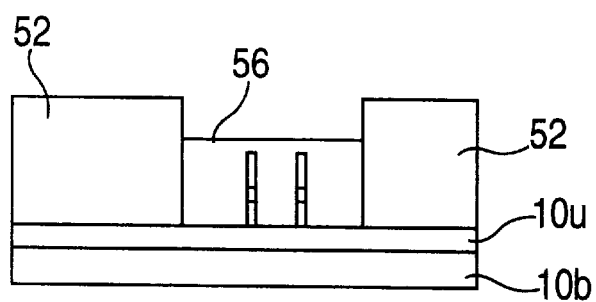
Figure 27A:
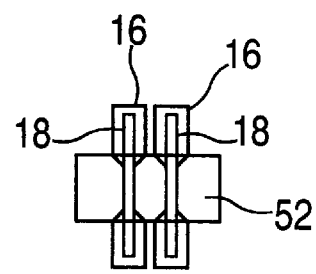

SiO2 or another like fill material is then deposited into the opening, planarized and recessed utilizing conventional processing steps that are well known in the art so as to provide the structure shown, for example, in FIGS. 27A and 27B. The recessed SiO2 layer is labeled as 56 in FIGS. 27A and 27B.

Figure 28B:
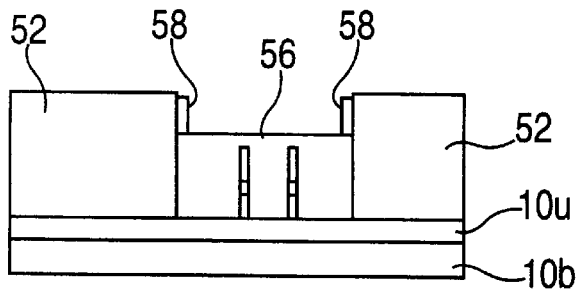
Figure 28A:
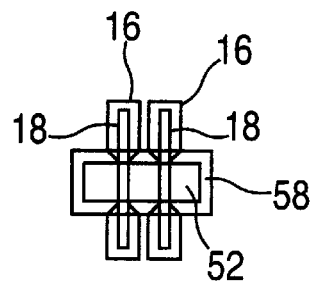

Insulative spacers 58 are then formed on the exposed vertical sidewalls of insulator 52 utilizing conventional processing steps such as deposition and etching well known to those skilled in the art providing the structure shown, for example, in FIGS. 28A and 28B.

Figure 29B:
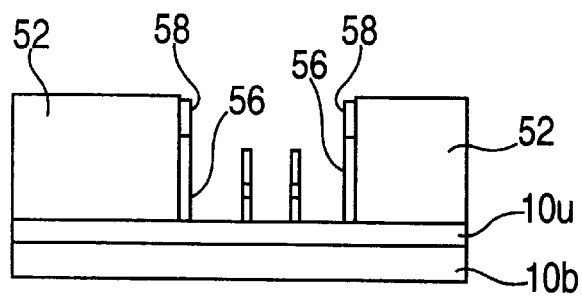
Figure 29A:
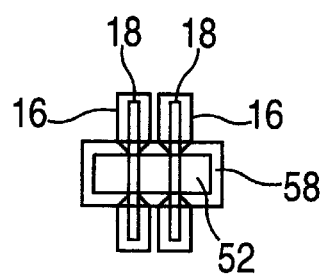

Next, and as shown in FIGS. 29A and 29B, the exposed portions of recessed SiO2 layer 56 are removed utilizing an etching process that is highly selective in removing SiO2 from the structure. Note that insulative spacers 58 are employed as an etch mask during this processing step of the present invention and that a gate opening is provided by this step of this present invention.

Gate dielectric 30 is then formed on vertical sidewalls of any silicon surfaces utilizing a conventional deposition or thermal growing process well known to those skilled in the art. Gate electrode 32 including one of the above-mentioned conductors is then formed into the gate opening and, if needed, the gate electrode is planarized utilizing a conventional planarization process providing the structure shown, for example, in FIGS. 30A and 30B.

Figure 30B:
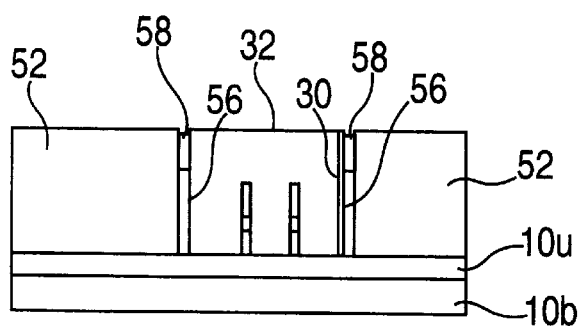
Figure 30A:
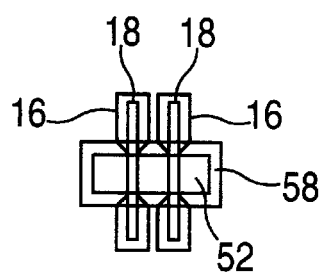

A patterned mask, not shown, is formed over the structure shown in FIGS. 30A and 30B leaving selective portions of the gate electrode exposed for etching. Etching of the exposed gate electrode is then performed providing the structure shown in FIGS. 31A, 31B' and 31B". Note that FIG. 31B' is a top view through cut x1–x2, while FIG. 31B" is a top view through cut y1–y2.

Silicide or other contacts 60 are then formed on sidewalls of the wide Fin segments using conventional processes well known to those skilled in the art. The resultant structure, including contacts 60, is shown in FIGS. 32A, 32B' and 32B".

It should be emphasized herein that the semiconductor structure of the present invention includes a plurality of FETs in which gate electrode 32 is shared between the various FETs.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A vertically oriented field effect transistor (FET) comprising: a channel region, a source region and a drain region, said channel region having a first horizontal width and said source and drain regions having a second horizontal width that is greater than said first horizontal width, each of said source and drain regions having tapered portions abutting said channel region with a horizontal width that varies in a substantially linear manner from said first horizontal width to second said horizontal width, and a gate region including a gate dielectric and a gate electrode adjacent said channel region, said source region, and said drain region, wherein said tapered portions of said drain region and said source region are aligned with said gate electrode.

2. The vertically oriented FET of claim 1 wherein said channel region, said source region and said drain region are comprised of a semiconducting material.

3. The vertically oriented FET of claim 2 wherein said semiconducting material is present atop a substrate which includes a bottom semiconducting layer and a top insulating layer.

4. The veritically oriented FET of claim 1 wherein said gate electrode is shared amongst a plurality of said channel regions.

5. The vertically oriented FET of claim 1 wherein said source and drain regions are self-aligned.

6. The vertically oriented FET of claim 1 wherein said source and drain regions include a silicide contact present thereon.

7. The vertically oriented FET of claim 1 wherein said channel region includes an oxide hard mask present on a top horizontal surface thereof.

8. The vertically oriented FET of claim 7 further comprising a nitride hard mask present atop said oxide hard mask.

\* \* \* \* \*